(12) United States Patent
Maasi et al.

(10) Patent No.: US 8,853,658 B2
(45) Date of Patent: Oct. 7, 2014

(54) FACE-TO-FACE OPTO-COUPLER DEVICE AND METHOD OF MANUFACTURE

(75) Inventors: Gopinath Maasi, Singapore (SG); Gary Tay, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 244 days.

(21) Appl. No.: 13/569,910

(22) Filed: Aug. 8, 2012

(65) Prior Publication Data
US 2014/0042344 A1    Feb. 13, 2014

(51) Int. Cl.
*G02B 27/00*    (2006.01)

(52) U.S. Cl.
USPC .......................................................... 250/551

(58) Field of Classification Search
USPC ................................................. 250/551, 221
See application file for complete search history.

(56) References Cited

U.S. PATENT DOCUMENTS

| | | | |
|---|---|---|---|
| 5,093,879 A * | 3/1992 | Bregman et al. | 385/93 |
| 7,009,166 B2 | 3/2006 | Shoji | |
| 7,042,306 B2 | 5/2006 | Roberson et al. | |
| 7,291,905 B2 | 11/2007 | Hirasawa et al. | |
| 7,488,964 B2 | 2/2009 | Horino | |
| 8,686,382 B2 * | 4/2014 | Schunk et al. | 250/551 |
| 2010/0230792 A1 | 9/2010 | Irving et al. | |
| 2011/0057128 A1 * | 3/2011 | Guenter et al. | 250/551 |
| 2013/0168553 A1 * | 7/2013 | Wong et al. | 250/341.1 |

* cited by examiner

*Primary Examiner* — Tony Ko

(57) ABSTRACT

An optoelectronic device is disclosed. The optoelectronic device may be employed as a single or multi-channel opto-coupler that electrically isolates one circuit from another circuit. The opto-coupler may include one or more folded leads that establish an enhanced isolation gap. The enhanced isolation gap may include an interruption in the insulation of the opto-coupler between the light source and the light detector. In addition, this interruption may further include a efficiency enhancer, or lens, to direct light emitted from the light source. Accordingly, the creepage distance and operational voltages of the opto-coupler can be increased while maintaining high efficiency levels.

20 Claims, 16 Drawing Sheets

FACE-TO-FACE OPTO-COUPLER DEVICE AND METHOD OF MANUFACTURE

FIELD OF THE DISCLOSURE

The present disclosure is generally directed toward optoelectronic devices and, in particular, opto-coupling devices.

BACKGROUND

In electronics, an opto-coupler, also referred to as an opto-isolator, photocoupler, or optical isolator, is an optoelectronic device designed to transfer electrical signals by utilizing light waves to provide coupling with electrical isolation between its input and output. One goal of an opto-coupler is to prevent high voltages or rapidly changing voltages on one side of the circuit from damaging components or distorting transmissions on the other side.

A typical opto-coupler includes a light source, such as a Light Emitting Diode (LED), a photodetector, and an insulation medium. As the name suggests, an optical path needs to be created between the LED and photodetector via the insulation medium. This is traditionally done by using an optically-transparent material such as silicone to create the light path. The insulation medium not only acts to allow the transmission of light from the LED to the photodetector, but the insulation medium also electrically insulates the input and output sides of the circuit.

Certain applications have stringent design rules regarding the true distance between the high voltage and low voltage side of the circuitry. In opto-couplers, the true distance between the high voltage side and low voltage side of the Printed Circuit Board (PCB) translates to be the closest metal-to-metal distance within the opto-coupler. This distance is often referred to as the opto-coupler's Distance Through Insulation (DTI), creepage distance, or the like. It should be appreciated that the DTI of opto-couplers is an important design consideration/constraint.

In particular, the specific dimension of an opto-coupler's DTI can influence the reliability and safety of the opto-coupler itself. For example, a thin insulation medium may cause increased electrostatic stress on the insulator of an opto-coupler during normal operation or discharge/surge events. Traditionally, by increasing the thickness of the insulation medium the stress on the insulator can be considerably reduced. However, as a result the efficiency and/or performance of the opto-coupler may be significantly decreased.

SUMMARY

It is, therefore, one aspect of the present disclosure to provide an improved opto-coupler design that overcomes and addresses the above-mentioned issues. In particular, embodiments of the present disclosure provide an opto-coupler with a folded leadframe design and a light conduit or optical efficiency enhancer disposed between the light source and the photodetector. By folding the leadframe one or more times, an increased DTI is achieved. Including an efficiency enhancer (e.g., a lens, silicone, air, combinations thereof, etc.) between the light source and the photodetector provides for an even greater DTI with improved optical coupling characteristics. In some embodiments, an increased DTI in a horizontal aspect (e.g., an original plane of the leadframe and the larger dimension of the opto-coupler) is achieved. Furthermore, the opto-coupler design may comprise co-planar leadframes on the input and output side and the one or more folds of the leadframe can increase the DTI in the same plane (e.g., the horizontal plane) as the leadframes are situated.

In accordance with at least one embodiment of the present disclosure the efficiency enhancer may comprise a nonconductive or insulative element (e.g., air, silicone, glass, plastic, and the like). In general, this efficiency enhancer may be configured to resist the flow of electric charge. Among other benefits, utilizing a nonconductive or insulative efficiency enhancer between the light source and photodetector of an opto-coupler allows the performance, safety, and reliability of the opto-coupler to be maintained while increasing the DTI considerably.

Additionally or alternatively, the efficiency enhancer may be configured to focus and/or enhance the transmission of light from the light source to the photodetector. In one embodiment, the efficiency enhancer may comprise a converging lens oriented such that light output from the light source is focused toward the photodetector of the opto-coupler. In another embodiment, the efficiency enhancer may comprise one or more lens elements configured to direct light to the general area of the photodetector. In some embodiments, this efficiency enhancer may include a convergent portion, divergent portion, and/or combination lens design.

It is an aspect of the present disclosure to provide an efficiency enhancer disposed between the photodetector and light source of an opto-coupler by creating a gap in a first mold material, where the first mold material is used as an internal insulation of the opto-coupler. In other words, the gap may be pre-formed by molding the first mold material around a specific volume disposed between the light source and the opto-coupler. Provided that this gap is at least somewhat translucent, it can act as the efficiency enhancer to enable the function provided by the opto-coupler. In some cases, the gap itself may serve as the efficiency enhancer. The specific volume may comprise a structure in the form of solid, hollow, or a combination solid and hollow construction. In one embodiment, the specific volume may remain in its molding position after the internal insulation material has cured or set. This specific volume may comprise elements that are transparent, translucent, and/or combinations thereof. Moreover, the specific volume may be designed in any number of shapes and/or sizes and may include one or more lens element. For example, the leadframe of the opto-coupler may include one or more features to capture and/or position a lens, or efficiency enhancer, in a position between the light source and photodetector. These one or more features may be folded, bent, and/or cut to cradle or otherwise restrict the movement of a lens or efficiency enhancer. Furthermore, the lens may be bonded (e.g., via UV curing, adhesive, pressure-sensitive adhesive, clamping, or the like) to the one or more features of the leadframe to capture the lens while the first molding material is introduced to the opto-coupler during the manufacturing process.

In some embodiments, the specific volume may be removed from the molded insulation material to form a void between the photodetector and the light source of the opto-coupler. As can be appreciated, the specific volume used to create this void may include molding draft angles to aid in its removal from the molded insulation material. It is a further aspect of the present disclosure that the void may be used as a receptacle for receiving a lens, light directing element, light diffusing element, and/or as an air gap between the insulation in contact with the light source and the insulation in contact with the photodetector. In the event that a space is created between the void and any efficiency enhancer (e.g., the space between a lens and the interior walls of the void, an air gap, and the like), the void may need to be capped or otherwise sealed before a second mold material is used to encapsulate the first molded material. Typically, this second mold material may be opaque in its appearance and as such may block the transmission of light. As can be appreciated, the cap or seal may comprise but is not limited to materials such as polyimide adhesive tape, Kapton® tape, polymers, cellulose, cellophane, glass, or other materials that can be used to cover the void in the first mold material. In some cases, the cap or seal may be affixed to the first mold material and/or the efficiency enhancer to cover the void. Affixing may be accomplished via UV curable adhesive, thermosetting epoxies, thermal bonding, thermal heat staking, adhesive layers, clamping, fastening, welding, ultrasonic welding, soldering, and/or combinations thereof. It is an aspect of the present disclosure that the cap or seal may be included to prevent the second mold material from entering the void area and/or blocking the efficiency enhancer/light path provided by the void.

In some embodiments, both an input side of the leadframe and an output side of the leadframe are folded across an input side fold line and output side fold line, respectively. The sensitive components of the opto-coupler (e.g., optoelectronic devices, wires, etc.) may be provided on one side of a fold line whereas other parts of the opto-coupler (e.g., lead ends) may be provided on the other side of a fold line.

It should be appreciated that any number of folds and fold lines can be accommodated by embodiments of the present disclosure. In some embodiments, the input and output sides of the leadframe may be folded from anywhere between 0 and 180 degrees and the different sides of the leadframe may be folded in the same or opposite directions. More explicitly, both the input and output side may be folded up or down. Alternatively, the input side may be folded up whereas the output side may be folded down or vice versa.

BRIEF DESCRIPTION OF THE DRAWINGS

The present disclosure is described in conjunction with the appended figures, which are not necessarily drawn to scale.

DETAILED DESCRIPTION

Figure 1A:
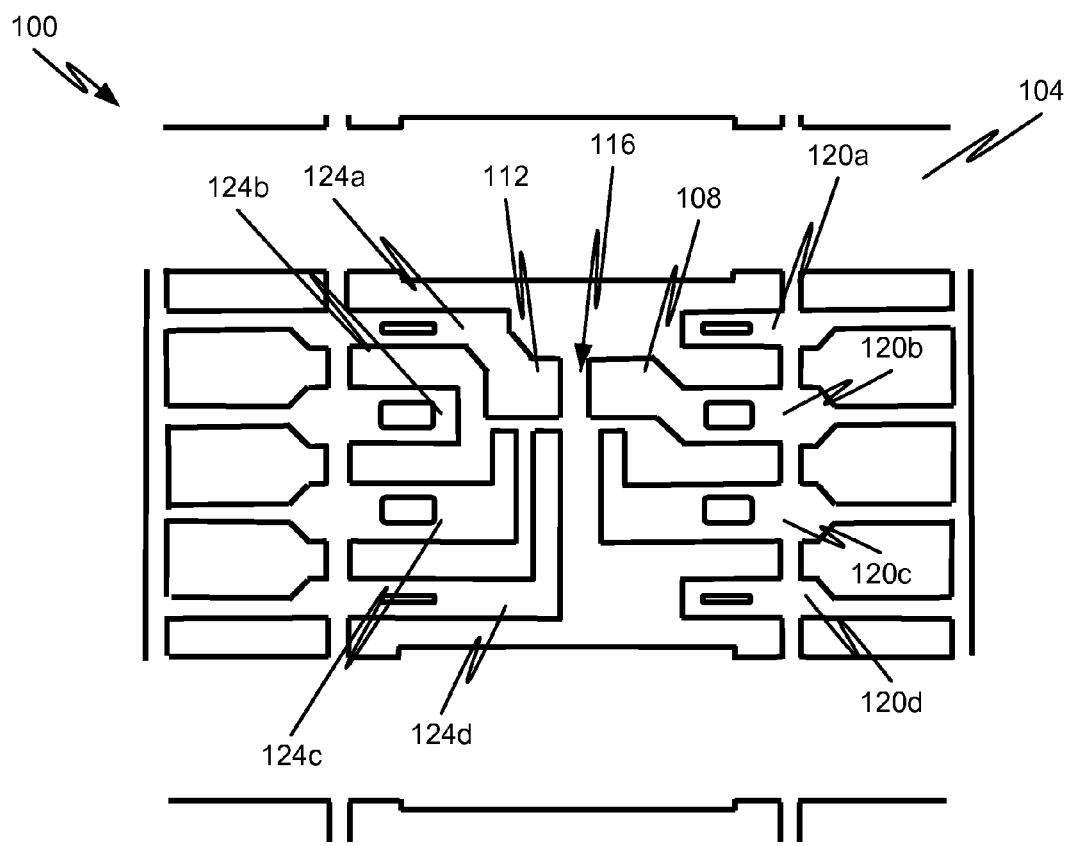
FIG. 1A is top view of an opto-coupler in a first manufacturing step in accordance with embodiments of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

As can be seen in FIGS. 1-10 and 12-14, various configurations of optoelectronic devices, opto-couplers, and intermediate opto-coupler configurations are depicted and described. Although many of the opto-couplers depicted in the figures correspond to opto-couplers at intermediate stages of manufacturing, one of ordinary skill in the art will appreciate that any of the intermediate products described herein can be considered an opto-coupler. In other words, one or more of the optoelectronic devices may be employed as opto-couplers or as components within a coupling system. In some embodiments, the opto-coupler devices described herein may be incorporated into any system which requires current and/or voltage monitoring, but is susceptible to transients. In some embodiments, the coupling system in which the opto-coupler devices described herein is rated to operate at about 5 kV, 10 kV, or more. Stated another way, the input side (e.g., a high-voltage side) of the opto-coupler device may be directly connected to a 5 kV, 10 kV, 15 kV or greater source without damaging the opto-coupler device or any electronic devices attached to the output side (e.g., a low-voltage side) of the opto-coupler device. Accordingly, the coupling system which employs the opto-coupler devices disclosed herein may be configured to operate in high-voltage or high-current systems but may also be configured to separate the high-voltage or high-current systems from a low-voltage or low-current system.

Referring initially to FIGS. 1-11, a process of manufacturing an opto-coupler according to a first possible configuration will be described in accordance with embodiments of the present disclosure. It should be appreciated that the method steps described herein (e.g., the steps of FIG. 11) may be performed in any order and are not limited to the examples described herein. Moreover, the method described herein can be used to manufacture any type of opto-coupler device described herein, including any intermediate opto-coupler or alternative opto-coupler configuration (e.g., the opto-coupler of FIGS. 1-10 or the opto-coupler of FIGS. 12-14).

At a first step, a sheet 100 comprising a leadframe 104 for an opto-coupler is received (step 1104). The sheet 100, in some embodiments, may correspond to a sheet of metal. The received leadframe 104 may have features for creating a single opto-coupler device or multiple opto-coupler devices. In some embodiments, the leadframe 104 may have features for simultaneously creating a plurality of opto-coupler devices. Specifically, the sheet of metal 100 may comprise a two-dimensional array of working spaces where each working space comprises the features of the single opto-coupler depicted in FIGS. 1A and 1B. Accordingly, although embodiments of the present disclosure will describe the process for manufacturing a single opto-coupler device, it should be appreciated that such steps may be duplicated in simultaneously or in parallel to increase the number of opto-couplers that are manufactured by a given process at a given time. Moreover, certain manufacturing steps described herein may be performed in an order other than that described or two or more steps may be combined into a single manufacturing step.

Referring back to FIGS. 1A and 1B, the leadframe 104 may comprise a plurality of features that have been created to establish various parts of an opto-coupler. These features may have been created in the leadframe 104 by any suitable process such as stamping, cutting, etching, etc. Specifically, a sheet of conductive material may have certain portions removed therefrom to establish discrete conductive elements. The conductive elements of the leadframe 104 may be constructed of metal (e.g., copper, silver, gold, aluminum, steel, lead, etc.), graphite, and/or conductive polymers.

In some embodiments, the received leadframe 104 comprises a first side 108 and a second side 112 separated by an isolation gap 116. As can be seen in FIG. 1B, the leadframe 104 may initially be received in a planar form (e.g., as a sheet). Thus, the isolation gap 116 initially comprises a first length that corresponds to a shortest distance between leads of the first side 108 and second side 112. The first length of the isolation gap 116 is substantially entirely in the original plane of the leadframe 104. For conversational purposes, the original primary plane of the leadframe 104 may be referred to as the x-direction or x-plane and the thickness of the leadframe 104 may be considered to be in the y-plane or y-direction. Thus, the isolation gap 116 originally only has a dimension in the x-plane or x-direction.

The first side 108 of the leadframe 104 may correspond to an input side of the opto-coupler and the second side 112 of the leadframe 104 may correspond to an output side of the opto-coupler. The input side 108 may be configured for connection to a circuit whose current and/or voltage is being measured and the output side 112 may be configured for connection to measurement and/or control circuitry.

The first side 108 may comprise a plurality of individual leads 120a-d and the second side 112 may also comprise a plurality of individual leads 124a-d. In the initial manufacturing stages, the individual leads 120a-d, 124a-d may be connected to one another via connecting portions of the leadframe sheet 100. Eventually, these connecting portions will be cut or removed thereby electrically isolating the first side 108 from the second side 112. Once the connecting portions are removed (e.g., the opto-coupler has been singulated or trimmed), the isolation gap 116 will correspond to the shortest distance across an insulating medium between the first side 108 and second side 112. Thus, the isolation gap 116 will also correspond to the creepage distance of the opto-coupler.

Figure 1B:
FIG. 1B is a side view of the opto-coupler depicted in FIG. 1A.

As can be seen in FIG. 1A, one of the leads on the first side 108 (e.g., second lead 120b) may include an enlarged area as compared to the other leads. This enlarged area may correspond to an eventual bonding or mounting surface for an optical component of the opto-coupler. Similarly, the second side 112 may also comprise one or more leads (e.g., first lead 124a) that has an enlarged area configured to receive and support one or more optical components of the opto-coupler.

Although the illustrative leadframe 104 depicted herein comprises four leads 120a-d on the first side 108 and four leads 124a-d on the second side 112, embodiments of the present disclosure are not so limited. Rather, the leadframe 104 may be provided with a greater or lesser number of leads on either side 108 or 112. Specifically, the first side 108 may comprise one, two, three, four, five, six, seven, eight, or more leads. The second side 112 may comprise the same number of leads as the first side 108 or it may comprise either a greater or lesser number of leads than the first side 112. The specific configuration of leads on the first and second sides 108, 112 should not be limited to the examples described herein.

Figure 2A:
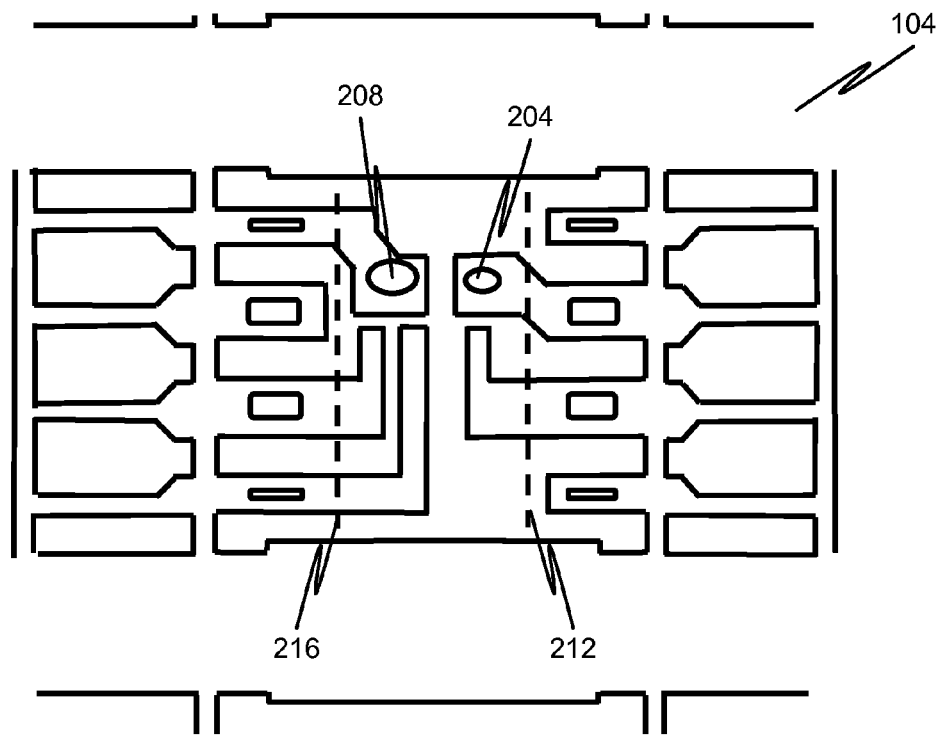
FIG. 2A is a top view of an opto-coupler in a second manufacturing step in accordance with embodiments of the present disclosure.
Figure 2B:
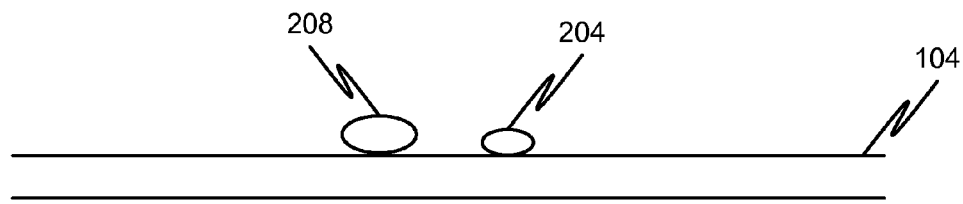
FIG. 2B is a side view of the opto-coupler depicted in FIG. 2A.

The manufacturing process continues with the attachment of a light source and light detector to the leadframe 104 (step 1108). The attachment process may be performed in a couple of steps and is generally depicted in FIGS. 2A, 2B, 3A, and 3B. As can be seen in FIGS. 2A and 2B, a first step of attaching the optical components is shown where a first adhesive 204 is applied to the bonding area of lead 120b of the first side 108. Additionally, a second adhesive 208 is applied to the bonding area of lead 124a of the second side 112. The first and second adhesives 204, 208 may be applied simultaneously or sequentially. In some embodiments, the adhesives 204, 208 may correspond to any type of known adhesive or compound used to affix or attach an optical device to metal. It may also be possible to employ welding, soldering, or similar bonding techniques that employ conductive materials rather than non-conductive adhesive materials. Non-limiting examples of the types of adhesives or adhesive materials that may be used for the adhesives 204, 208 include thermosetting epoxies, UV curable epoxies, adhesive tapes, solder, etc.

In some embodiments, the first adhesive 204 is applied to the bonding area of the lead 120b between the isolation gap 116 and a first fold line 212. Likewise, the second adhesive 208 is applied to the bonding area of the lead 124a between the isolation gap 116 and a second fold line 216. This means that both adhesives 204, 208 are positioned between both fold lines 212, 216.

Figure 3A:
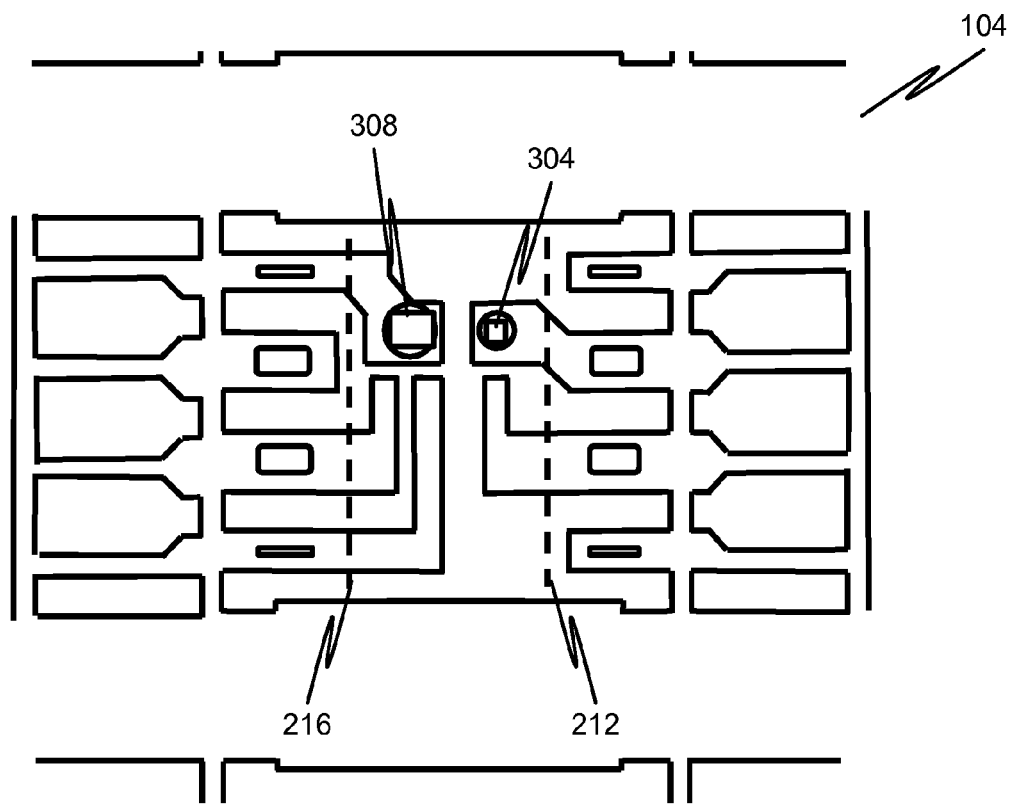
FIG. 3A is a top view of an opto-coupler in a third manufacturing step in accordance with embodiments of the present disclosure.
Figure 3B:
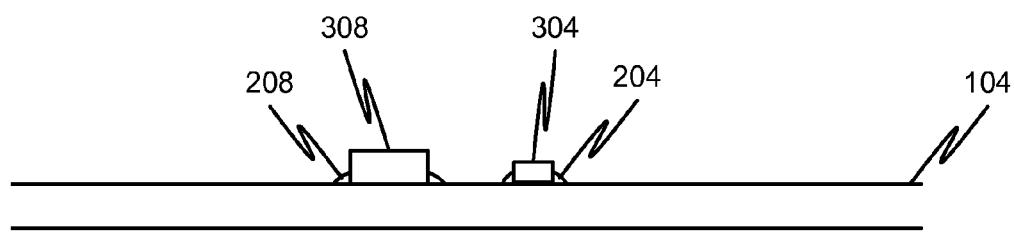
FIG. 3B is a side view of the opto-coupler depicted in FIG. 3A.

As depicted in FIGS. 3A and 3B, a light source 304 may be connected to the first side 108 via the first adhesive 204 and a light detector 308 may be connected to the second side 112 via the second adhesive 208.

The light source 304 and light detector 308 may be used to transmit signals across the isolation gap 116 in the form of optical signals. The signals transmitted across the isolation gap 116 may correspond to electrical signals that are converted into optical signals by the light source 304. The light detector 308 then converts the optical signals back into electrical signals for transmission across one or more of the leads 124a-d of the second side 112.

In some embodiments, the light source 304 may be a single light source or a plurality of light sources. Likewise, the light detector 308 may be a single detector component or multiple detector components.

In some embodiments, the light source 304 corresponds to a surface mount LED, a traditional LED (e.g., with pins for thru-hole mounting), an array of LEDs, a laser diode, or combinations thereof. The light source 304 is configured to convert electrical signals (e.g., current and/or voltage) from one or more of the leads 120a-d into light. The light emitted by the light source 304 may be of any wavelength (e.g., either in or out of the visible light spectrum).

In some embodiments, the light detector 308 corresponds to device or collection of devices configured to convert light or other electromagnetic energy into an electrical signal (e.g., current and/or voltage). Examples of a suitable light detector 308 include, without limitation, a photodiode, a photoresistor, a photovoltaic cell, a phototransistor, an Integrated Circuit (IC) chip comprising one or more photodetector components, or combinations thereof. Similar to the light source 304, the light detector 308 may be configured for surface mounting, thru-hole mounting, or the like.

In some embodiments, one surface of the light source 304 is an anode and another surface of the light source 304 is a cathode. One of the anode and cathode may be electrically connected to one of the leads 120a-d and the other of the anode and cathode may be electrically connected to a different one of the leads 120a-d. By creating a potential between the anode and cathode of the light source 304, the light source 304 may be configured to emit light of a predetermined wavelength. It should be appreciated that not every lead 120a-d needs to be connected either physically or electrically with the light source 304.

Like the light source 304, the light detector 308 may be mounted on one of the leads 124a-d of the second side 112 and may be electrically connected to one or more leads 124a-d of the second side 112. In some embodiments, the manufacturing process continues by establishing an electrical connection between the optical components and the leads of the leadframe 104 such that voltage and/or current at the leads can be converted into optical energy or vice versa by the optical components. Accordingly, the light source 304 and light detector 308 may be connected to one or more of the leads of the leadframe 104 with one or more wires 404, 408.

Input side wires 404 may be used to carry current from a lead on the first side 108 to the light source 304. Output side wires 408 may be used to carry current from the light detector 308 to an output circuit via one or more of the leads 124a-d.

It should be appreciated that neither the light source 304 nor the light detector 308 are to be electrically or physically connected to every lead 120a-d, 124a-d, although such a configuration is possible.

Figure 4A:
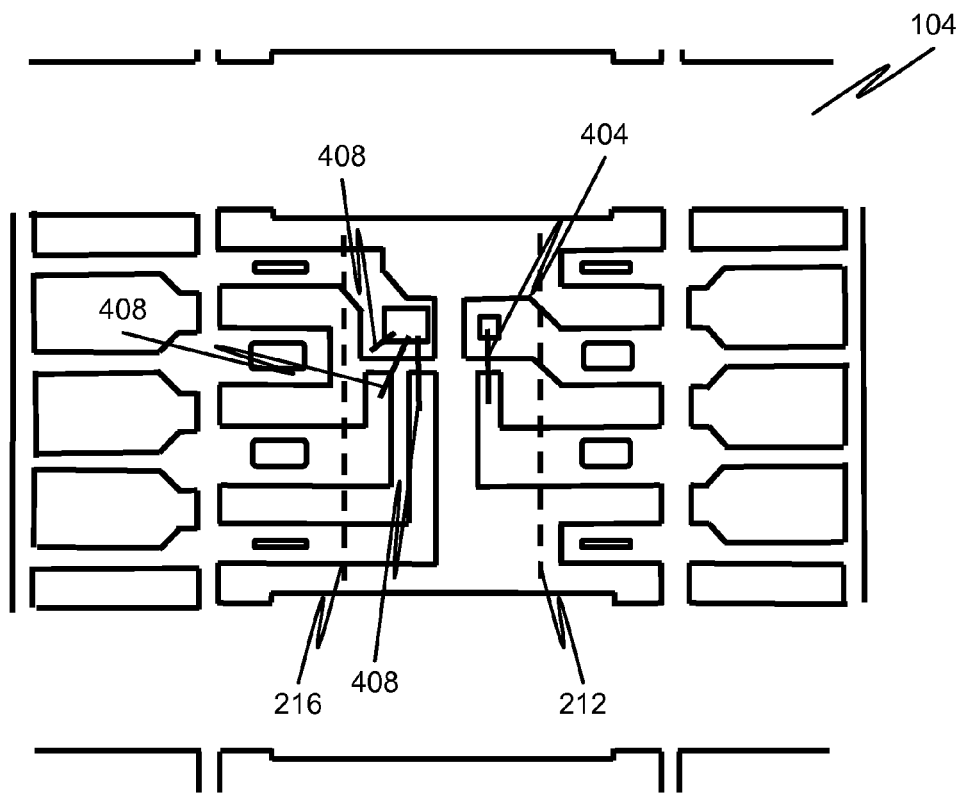
FIG. 4A is a top view of an opto-coupler in a fourth manufacturing step in accordance with embodiments of the present disclosure.

FIG. 4A shows how both input side wires 404 and output side wires 408 are provided between the fold lines 212, 216. In other words, it may be advantageous to restrict the wires from crossing the fold lines 212, 216 as this may ultimately cause undue stress or tension to be exerted on the wires when the leads are folded at the fold lines 212, 216.

Figure 4B:
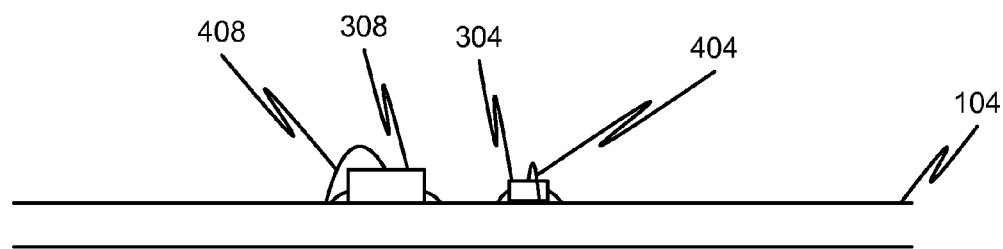
FIG. 4B is a side view of the opto-coupler depicted in FIG. 4A.

FIG. 4B shows a simplified view of the output side wires 408. In particular, although there are three output side wires 408 depicted in FIG. 4A, FIG. 4B only shows a single output side wire 408. This is not intended to limit embodiments of the present disclosure, but rather is intended to simplify the embodiments depicted in the figures to ease understanding of the present disclosure.

Figure 5A:
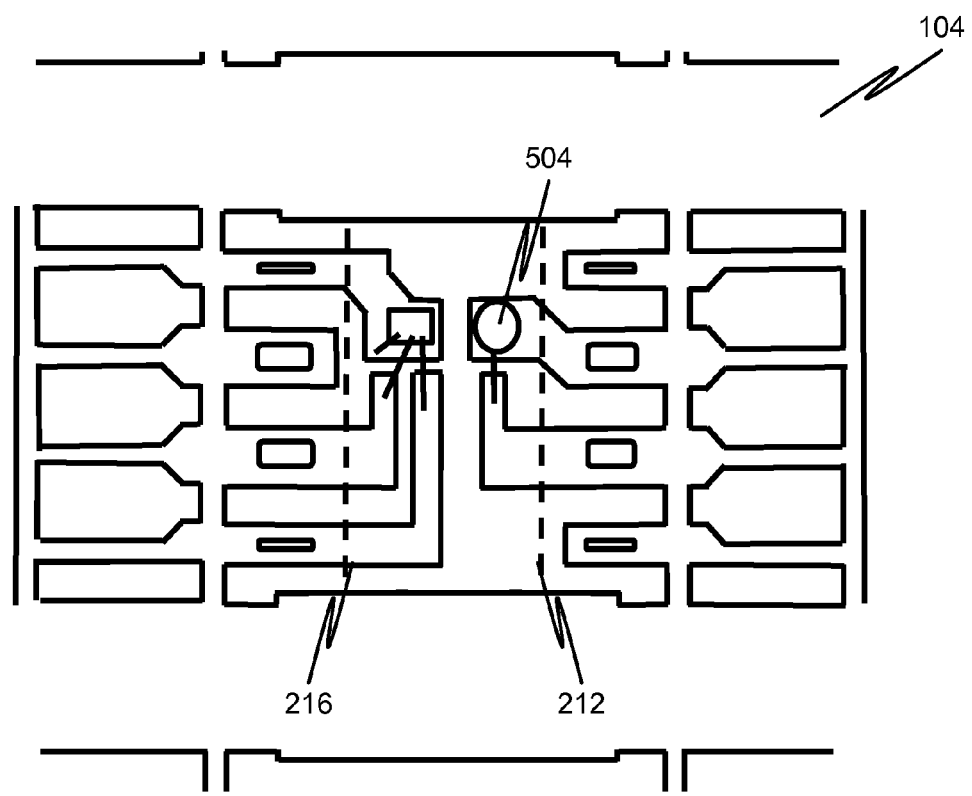
FIG. 5A is a top view of an opto-coupler in a fifth manufacturing step in accordance with embodiments of the present disclosure.
Figure 5B:
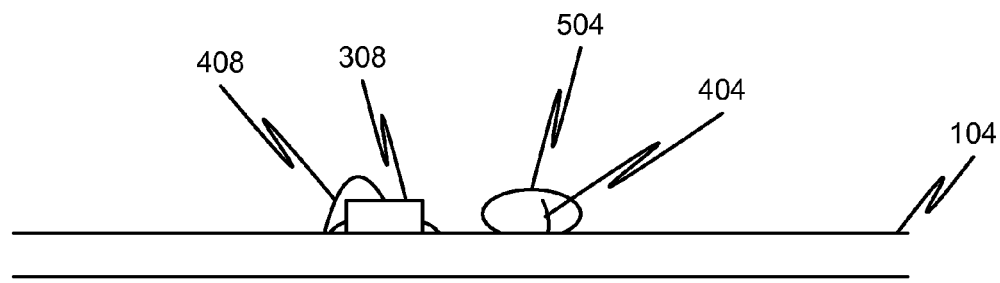
FIG. 5B is a side view of the opto-coupler depicted in FIG. 5A.

An optional manufacturing step is depicted in FIGS. 5A and 5B. Specifically, the light source 304 and/or light detector 308 may be partially or completely covered with a protective material 504 (step 1116). In some embodiments, an optically transparent or translucent material may be used as the protective material 504, especially if the protective material 504 completely covers an optical component, such as the light source 304. The protective material 504 may also preferably comprise non-conductive or insulative properties. Suitable types of materials that may be used as the protective material 504 include, without limitation epoxy, silicone, a hybrid of silicone and epoxy, phosphor, a hybrid of phosphor and silicone, an amorphous polyamide resin or fluorocarbon, glass, plastic, or combinations thereof. In some embodiments, the protective material 504 provides physical protection for the optical component (e.g., light source 304) as well as the connection between the wire 404 and the optical component. However, the protective material 504 does not necessarily need to cover the entire wire in addition to covering the optical component. Accordingly, the wire 404 may protrude from the protective material 504 and extend to a different lead (e.g., lead 120c).

Figure 6A:
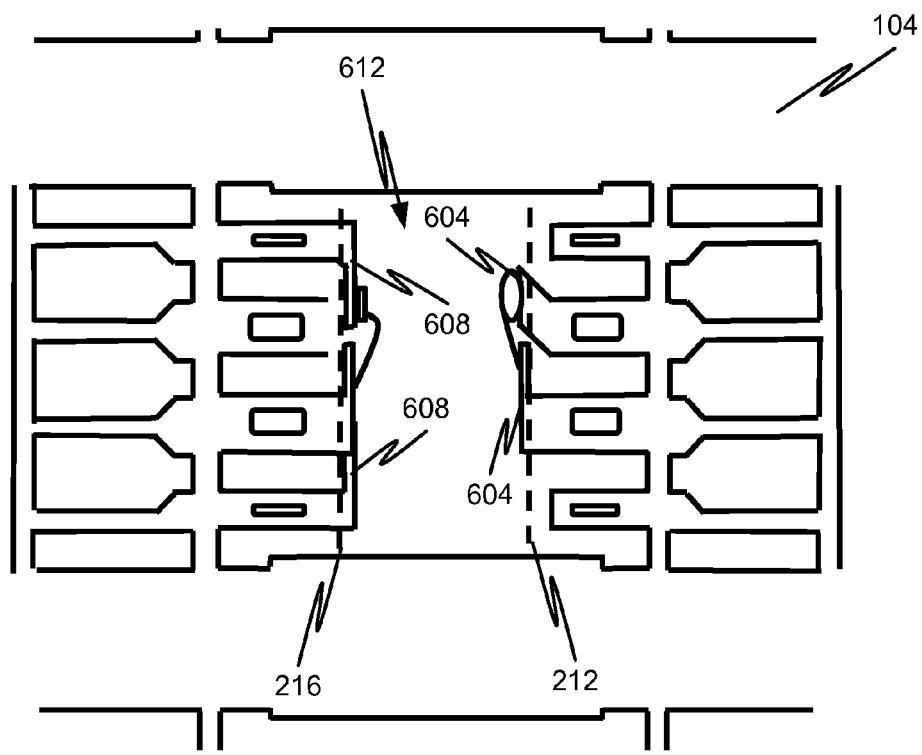
FIG. 6A is a top view of an opto-coupler in a sixth manufacturing step in accordance with embodiments of the present disclosure.
Figure 6B:
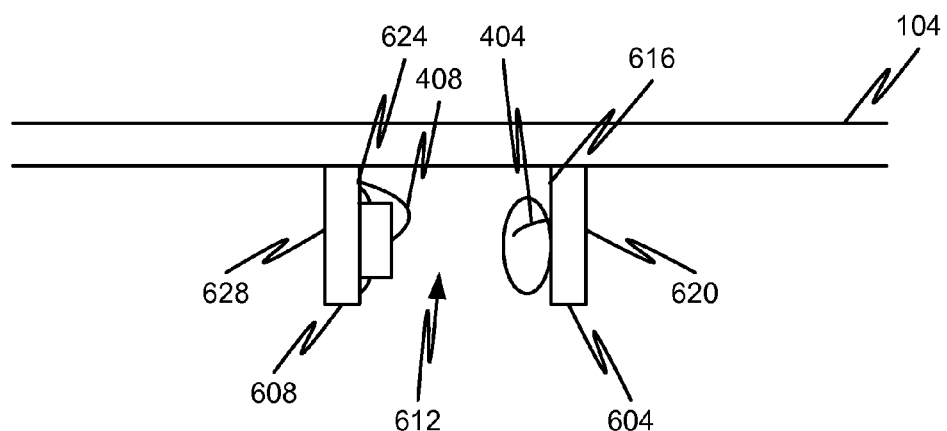
FIG. 6B is a side view of the opto-coupler depicted in FIG. 6A.

The next step in the manufacturing process may include one or more folding steps where the leadframe 104, or leads 120, 124 of the leadframe are folded at or about the fold lines 212, 216 (step 1120). FIGS. 6A and 6B depict the optocoupler after both leads 120, 124 have been folded at or about the fold lines 212, 216. In some embodiments, the leads 120, 124 are folded in the same direction (e.g., both upward or both downward) such that both the light source 304 and light detector 308 are moved away from the original plane of the leadframe 304 in the y-direction and are not separated by the original plane of the leadframe 304. In some embodiments, one or more leads of the first side 108 may be folded in one direction (e.g., upward) while one or more leads of the second side 112 may be folded in the opposite direction (e.g., downward). This opposite folding may result in the light source 304 being separated from the light detector 308 by the original plane of the leadframe 304. An example of such a configuration is depicted in FIG. 12. Yet another possible folding configuration may involve folding one or more leads of one side (e.g., folding one or more of leads 120a-d) and not folding any leads of the other side (e.g., not folding any of leads 124a-d).

Although FIGS. 6A and 6B depict the leads 120, 124 being folded in the same direction and being folded to an angle that is approximately orthogonal to the original plane of the leadframe 104 (e.g., parallel to the y-plane), it should be appreciated that embodiments of the present disclosure are not so limited. Rather, one or both leads 120, 124 may be folded by any angle varying between 1 degree and 179 degrees. The amount of folding performed in this step may depend on the material properties of the leadframe 104 and whether the material can undergo significant folding without breaking or inadvertently deforming.

The 90 degree folding configuration of FIGS. 6A and 6B may be advantageous when both leads 120, 124 are folded in the same direction because such a folding configuration may result in the light source 304 directly facing the light detector 308. This direct facing of optical components may help increase the efficiency with which light transmitted by the light source 304 is detected at the light detector 308, thereby improving the operational behavior of the opto-coupler.

As can be seen in FIG. 6A, the folding of the leads 120, 124 may establish an enhanced isolation gap 612. Specifically, the enhanced isolation gap 612 is larger than the original isolation gap 116 in the x-direction or x-plane. The example of FIGS. 6A and 6B show that the enhanced isolation gap 612 does not comprise any substantial dimension in the y-direction or y-plane, in particular, because the leads 120, 124 have been folded in the same direction. It should be appreciated that such a configuration is not required.

The enhanced isolation gap 612 helps to increase the creepage distance between the leads 120 of the first side 108 and the leads 124 of the second side 112. More specifically, the increased isolation gap 612 may have a distance corresponding to the linear distance between a bonding surface 616 of the folded section of the first side 604 and a bonding surface 624 of the folded section of the second side 608. These bonding surfaces may correspond to the original bonding surfaces of the leads 120, 124 that were originally in the x-plane, but due to the folding of the leads 120, 124 are now out of the x-plane. The enhanced isolation gap 612 can increase the voltage handling capabilities of the opto-coupler. In some embodiments, voltage capacities can be doubled by simply folding one or both leads 120, 124. As a non-limiting example, the enhanced isolation gap 612 may comprise a distance of between approximately 2 mm and 7 mm.

Because the enhanced isolation gap 612 comprises its primary dimensions in the x-plane (e.g., the original plane of the leadframe 104 and the major axis of the opto-coupler), it is possible to greatly increase the creepage distance without significantly altering the size of the opto-coupler itself or without significantly complicating the manufacturing process of the opto-coupler.

The folded section of the first side 604 may also have a first opposing surface 620 that opposes the bonding surface 616. Similarly, the folded section of the second side 608 may comprise a second opposing surface 628 that opposes the bonding surface 624. The first opposing surface 620 may coincide with the first fold line 212 and the second opposing surface 628 may coincide with the second fold line 216.

Figure 7A:
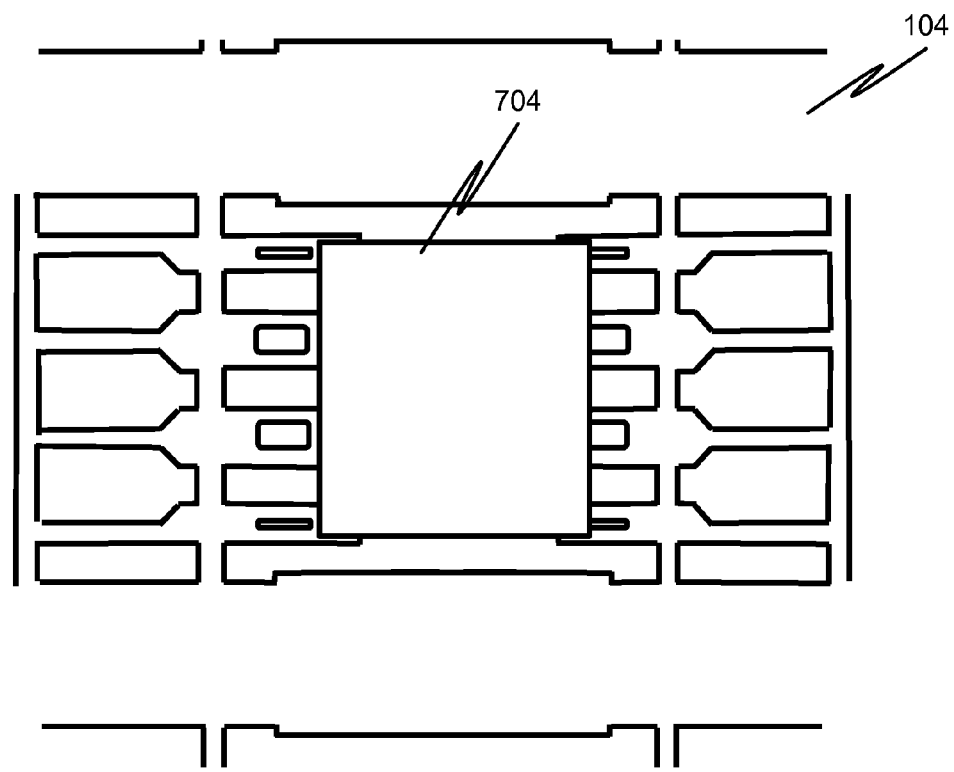
FIG. 7A is a top view of an opto-coupler in a seventh manufacturing step in accordance with embodiments of the present disclosure.
Figure 7B:
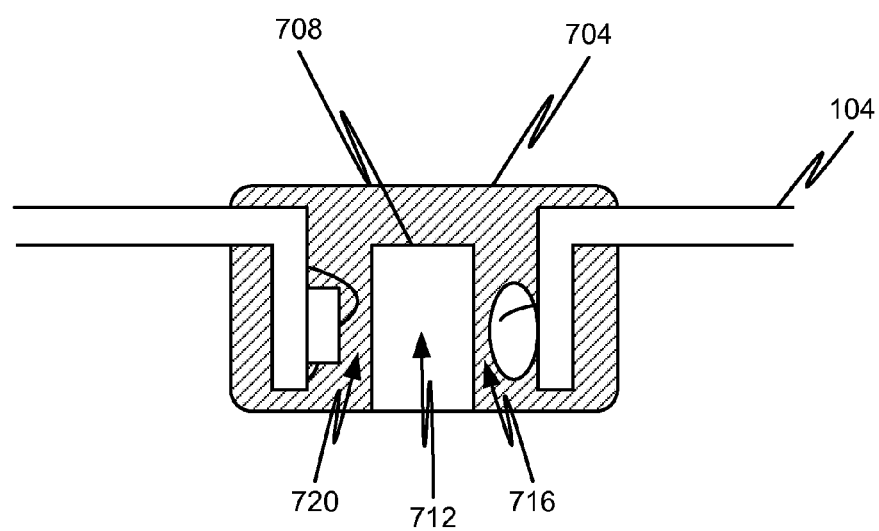
FIG. 7B is a sectioned side view of the opto-coupler depicted in FIG. 7A.

After one or both leads 120, 124 have been folded and the enhanced isolation gap 612 has been appropriately sized, the manufacturing process may continue with the application of a first mold material 704 to the opto-coupler (step 1124). Specifically, as can be seen in FIGS. 7A and 7B, an optically translucent or transparent first mold material 704 may be applied around both leads 120, 124 to essentially fix the relative positions of the leads 120, 124, the optical components attached thereto, and the size of the enhanced isolation gap 612.

In some embodiments, the first mold material 704 may be constructed of any polymer or combination of polymers that are optically translucent or transparent using extrusion, machining, micro-machining, molding, injection molding, or a combination of such manufacturing techniques. Furthermore, the first mold material 704 may comprise insulative properties, thereby inhibiting the flow of current from the first side 108 to the second side 112 across the enhanced isolation gap 612. In accordance with aspects of the present disclosure, the first mold material 704 may include a gap 712 in the insulation that is disposed between the light source 304 and the light detector 308 of the opto-coupler. The gap 712 may function as a efficiency enhancer and/or be configured to receive one or more optical elements. In some embodiments, the gap 712 itself may be the efficiency enhancer or optical element. Some examples of a efficiency enhancer element include but are not limited to a lens, light pipe, translucent gas, translucent fluid, optically clear thermosetting epoxy, optically clear UV curable epoxy, and/or combinations thereof. As can be appreciated, the gap 712 or efficiency enhancer may comprise one or more nonconductive or insulative elements. These elements may be configured to resist the flow of electric charge.

In accordance with some embodiments of the present disclosure, the efficiency enhancer may be designed to minimize and/or eliminate any coupling losses through the included gap 712. Using optically clear, transparent, light directing, and/or focusing elements/lenses may provide better coupling efficiency than the use of less transparent or diffuse gap 712 elements. As can be appreciated, this arrangement allows for greater DTIs when compared to conventionally manufactured opto-couplers. For example, opto-couplers measure the DTI as the distance between the closest metal of the high voltage side and the closest metal of the low voltage side within the opto-coupler. Typically, the insulation of an opto-coupler is placed in between this metal-to-metal area. Unfortunately, the conventional insulation approach (or first mold material 704) can negatively affect the efficiency of an opto-coupler because the light may be filtered by the insulation material itself. It is an aspect of the present disclosure to balance the filtering effect of certain insulation material with the translucency of the efficiency enhancer material in the gap 712 to, among other things, increase the achievable DTI of the opto-coupler. For instance, the present disclosure shows that the first mold material 704 includes a gap 712 where the filtering insulation can be reduced to a first insulation area 716 and a second insulation area 720. In a conventional opto-coupler the DTI would have been the sum of some distance across the first insulation area 716 and the second insulation area 720 alone. In contrast, the present disclosure increases this distance by including the area that is separated by the gap 712 into the calculation.

Figure 8A:
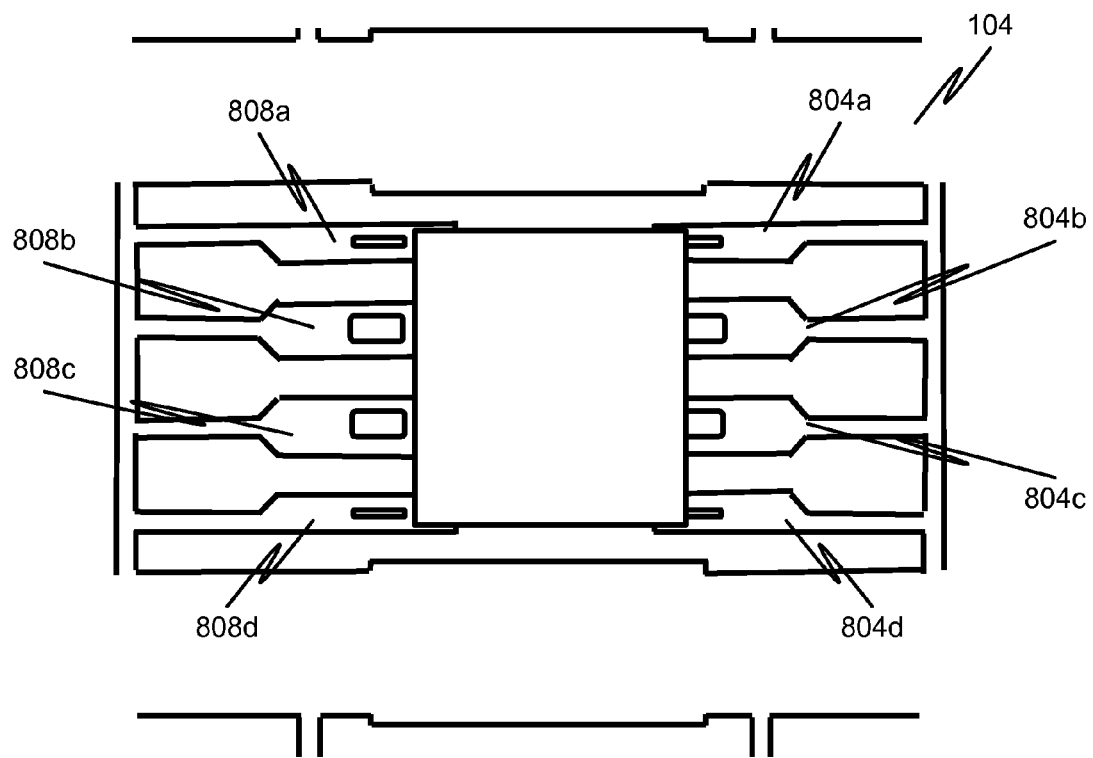
FIG. 8A is a top view of an opto-coupler in an eighth manufacturing step in accordance with embodiments of the present disclosure.
Figure 8B:
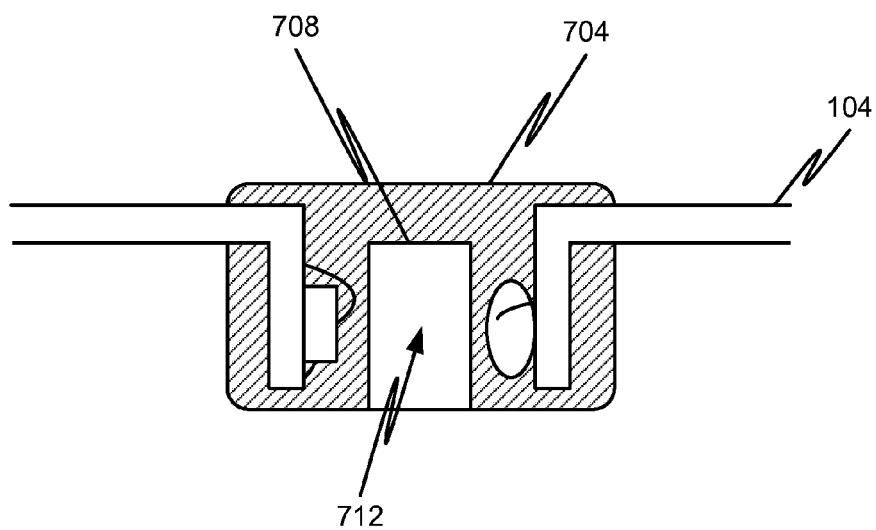
FIG. 8B is a sectioned side view of the opto-coupler depicted in FIG. 8A.

FIGS. 8A and 8B show a next step in the manufacturing process whereby a first trimming of the leadframe 104 is performed (step 1128). In some embodiments, the first trimming step removes certain amounts of materials from the leadframe 104 to create first trimmed leads 804a-d on the first side 108 and first trimmed leads 808a-d on the second side 108. The first trimmed leads 804, 808 are still in the original plane of the leadframe 104, but are now sized to be inserted into a Printed Circuit Board (PCB) or the like.

Figure 8C:
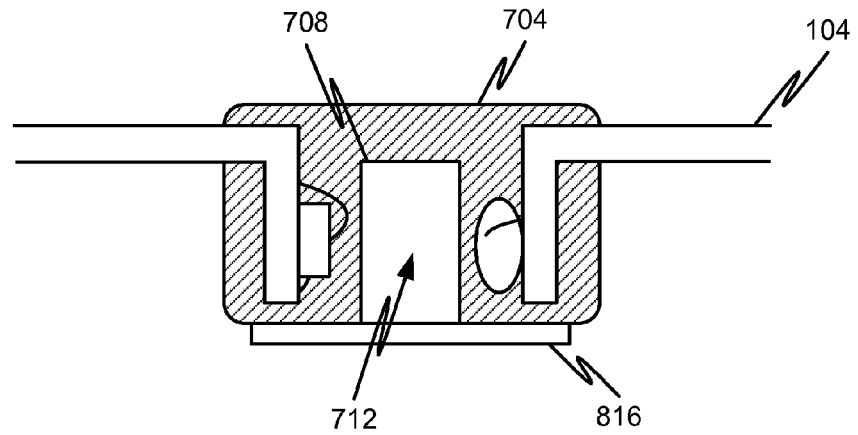
FIG. 8C is a sectioned side view of a first embodiment of the opto-coupler depicted in FIG. 8A.
Figure 8D:
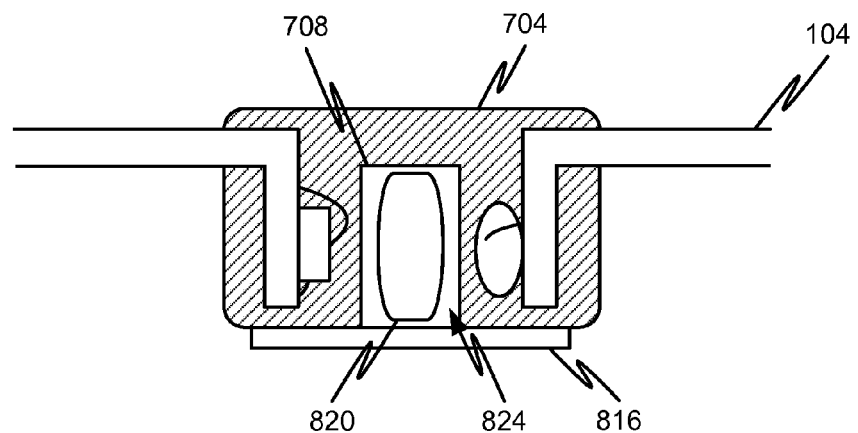
FIG. 8D is a sectioned side view of a second embodiment of the opto-coupler depicted in FIG. 8A.
Figure 8E:
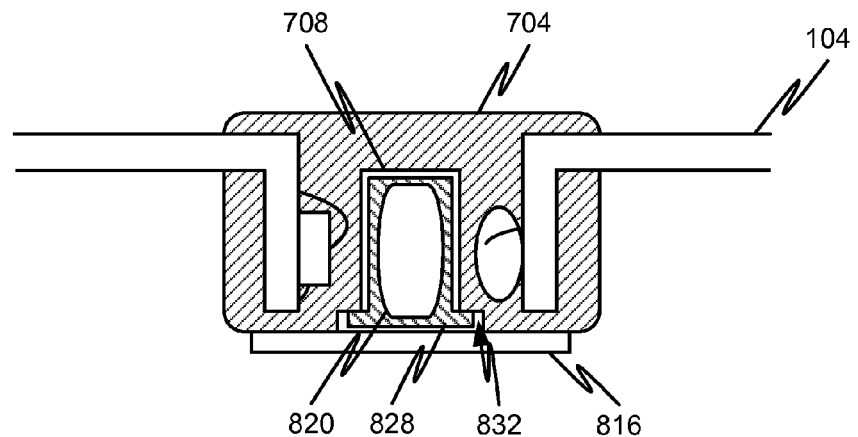
FIG. 8E is a sectioned side view of a third embodiment of the opto-coupler depicted in FIG. 8A.

FIGS. 8C-8E show sectioned side views of embodiments of the opto-coupler depicted in FIG. 8A. Specifically, the gap 712 of the opto-coupler is shown utilizing various elements and/or manufacturing techniques for different efficiency enhancer elements in accordance with embodiments of the present disclosure.

Referring to FIG. 8C a cross-section of an opto-coupler is shown with a gap 712 that is disposed in a path between the light source 304 and the light detector 308 in accordance with at least one embodiment of the present disclosure. As previously stated, the gap 712 depicted may comprise but is not limited to air, silicone, epoxy, glass, plastic, polymer, translucent material, and/or combinations thereof. In some instances it may be beneficial to cover the gap 712 area with a cap, cover, or seal 816. For example, the gap 712 may comprise air, a fluid, a cured material, and/or an uncured material. The cap 816 may prevent contaminants from entering the gap 712 and affecting the efficiency of the opto-coupler where an unwanted substance at least partially blocks the light path between the light source 304 and the light detector 308. Additionally or alternatively, the cap 816 may prevent a second mold material from entering the gap 712 in subsequent manufacturing and/or molding steps. The cap 816 may be especially useful in embodiments where the gap comprises a gas (e.g., air).

In some embodiments, the gap 712 may remain uncovered in which case the cap 816 is excluded from the manufacturing process. For example, the material comprising the gap 712 area and/or efficiency enhancer may be of sufficient structure to prevent contaminants and/or a second mold material from entering the gap 712 area. In other words, the sufficient structure may be achieved by using at least a partially solid material in the gap 712 that can essentially prevent the flow of foreign material into the light path of the opto-coupler. Alternatively, it may be deemed unnecessary to cover the gap 712 due to a manufacturing technique that may prevent the entrance of unwanted material into the light path of the opto-coupler (e.g., techniques such as molding a second mold material around the first material, where the open end of the gap 712 is parallel and directly facing the second mold material causing a pressure difference between the gap 712 and the area outside of the gap preventing the flow of material into the gap 712; using a second mold material that is less dense than a material that is inside the gap 712; and/or combinations thereof).

FIG. 8D shows a cross-section of an opto-coupler and gap 712 where the gap 712 further comprises a lens element 820 that is interposed in the pathway between the light source 304 and the light detector 308 in accordance with embodiments of the present disclosure. The lens element 820 may comprise one or more light directing features to converge, diverge, or directly transmit light from one side of the lens element 820 to the other side. Additionally or alternatively, the lens element 820 may be a fiber optic component designed to act as a conduit of light from one side of the lens element 820 to the other including the benefits of fiber optic design. At least one benefit of utilizing fiber optic elements allows for a majority of internal reflections of light within the lens element 820 to be directed through the lens element 820 rather than dissipate out of an unintended side of the lens element 820. In some embodiments, the lens element 820 may comprise a combination of light directing features to achieve a specific light path characteristic. Moreover, the light directing features of the lens element 820 may be selected based on efficiency rating and/or DTI of the opto-coupler.

In some embodiments, the lens element 820 may be held in place by the sides of the gap 712. In one embodiment, the lens element 820 may be initially affixed in a first location inside the gap 712 to prevent movement of the lens element 820 within the gap 712. This affixing of the lens element may be achieved using similar techniques as previously described relating to the affixing of the cap 816. Additionally or alternatively, an interposed lens element 820 may include a void, air path, or space 824 between the lens element 820 and one or more walls of the gap 712. It is anticipated that this space 824 may be filled with an epoxy, UV curable adhesive, silicone, or the like. Among other benefits, filling the space 824 between the lens element 820 and the gap 712 area prevents undesired movement of the lens element 820 during operation and/or manufacturing and may even prevent the entrance of unwanted substances into the light path during the manufacturing or handling process. In some embodiments, the interposed lens element 820 and gap 712 may be covered by a cap 816 as previously described.

Referring now to FIG. 8E, a cross-section of an opto-coupler and gap 712 including a lens element 820 and attached housing or mold material 828 interposed in the pathway between the light source 304 and the light detector 308 is shown in accordance with embodiments of the present disclosure. The lens element 820 may be attached to the housing 828 via one or more operations such as molding, adhering, clamping, pressure setting, bonding, welding, fastening, and the like. In some embodiments, the housing 828 may completely encapsulate the lens element 820. Alternatively, the housing 828 may be configured to at least partially contain the lens element 820. In this case, the housing 828 may provide for open sides to allow the working faces of the lens element 820 to be uncovered, and/or the housing 828 may at least partially contain an outer edge of the lens element 820.

In one embodiment, the first mold material 704 may be configured to receive the housing 828 and lens element 820 via a molded receptacle area 832. The molded receptacle area 832 may include features to key the location and/or orientation of the housing 828 and lens element 820. Additionally, the housing 828 may include features to at least partially match the key features of the molded receptacle area 832. In any case, the housing 828 may be affixed in position with the first mold material 704 via one or more of the following techniques molding, adhering, clamping, pressure setting, bonding, welding, fastening, and the like. Included among the anticipated attachment techniques, is an interference, or press fit, between at least a portion of the housing 828 and at least a portion of the molded receptacle area 832. This type of attachment technique may be used to maintain a substantially sealed portion within the molded receptacle area 832. Among other things, the substantially sealed portion may prevent any unwanted mold material or debris from entering the molded receptacle area 832 during and/or after the manufacturing process. In some cases, the housing 828 and the lens element 820 may be retained in the gap 712 via a cap 816 as previously described. This cap 816 may be especially useful in embodiments where an interference fit, press fit, or the like is not employed between the housing 828 and the molded receptacle area 832. For instance, the cap 817 may be used to cover an open air gap that may exist between the molded receptacle area 832 and an outer area of the first mold material 704.

In any of the disclosed embodiments herein, the gap 712 may include features to predict a location, position, and/or orientation of a lens element 820 during manufacturing and in operation. Specifically, the gap 712 may be configured as a unique shape, incorporate keying features to receive the lens element 820 and/or be configured to receive a lens element that is independent of orientation (e.g., a cubic-shaped lens, a efficiency enhancer element with at least four optically polished sides, and the like). Additionally or alternatively, the gap 712 may be constructed in one or more shapes to accept a lens element 820 or efficiency enhancer in only one orientation (e.g., a rectangular opening of the gap 712 and a lens element 820 that is configured to insert into the gap 712 in a working orientation and in no other orientation).

Figure 9A:
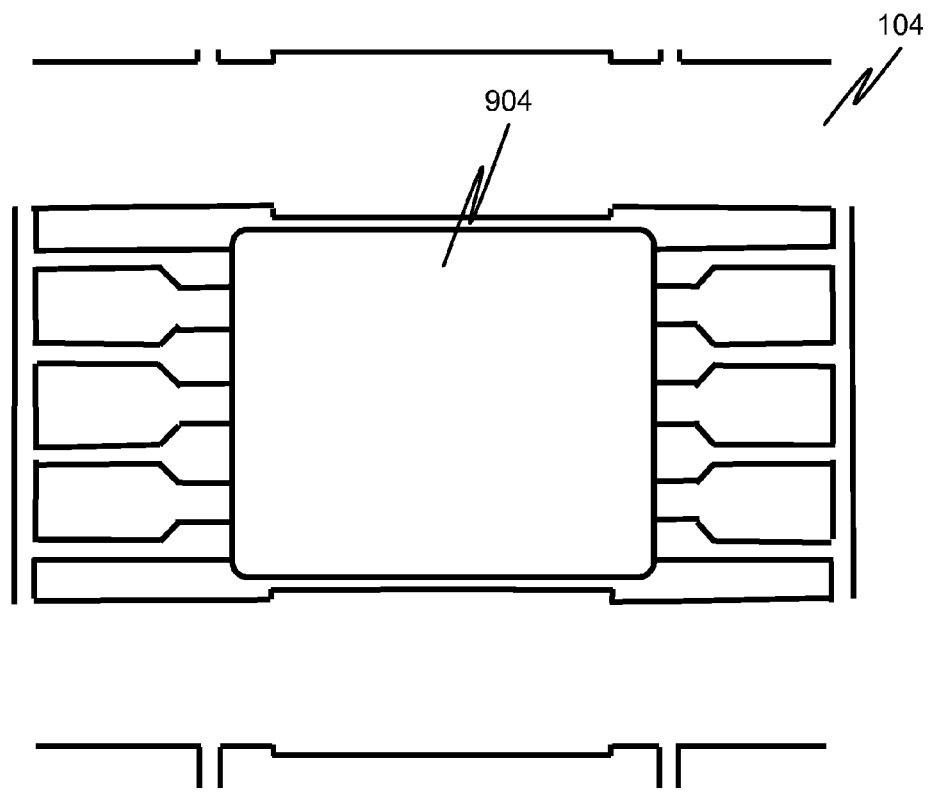
FIG. 9A is a top view of an opto-coupler in a ninth manufacturing step in accordance with embodiments of the present disclosure.
Figure 9B:
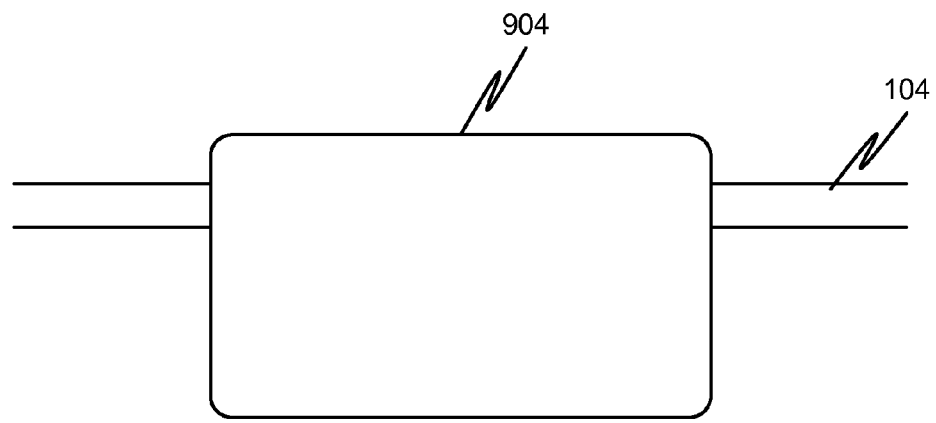
FIG. 9B is a side view of the opto-coupler depicted in FIG. 9A.

FIGS. 9A and 9B show a next step in the manufacturing process where a second mold material 904 is applied around the first mold material 704 (step 1132). The second mold material 904 may completely enclose the first mold material 704. In some embodiments, the second mold material 904 is insulative and optically opaque. The second mold material 904 helps to ensure that external light doesn't reach the optical cavity of the opto-coupler (e.g., the enhanced isolation gap 612 and the first mold material 704). The second mold material 904 also helps to ensure that light emitted by the light source 304 does not exit the opto-coupler, thereby increasing the efficiency of optical coupling between the light source 304 and light detector 308.

Figure 10A:
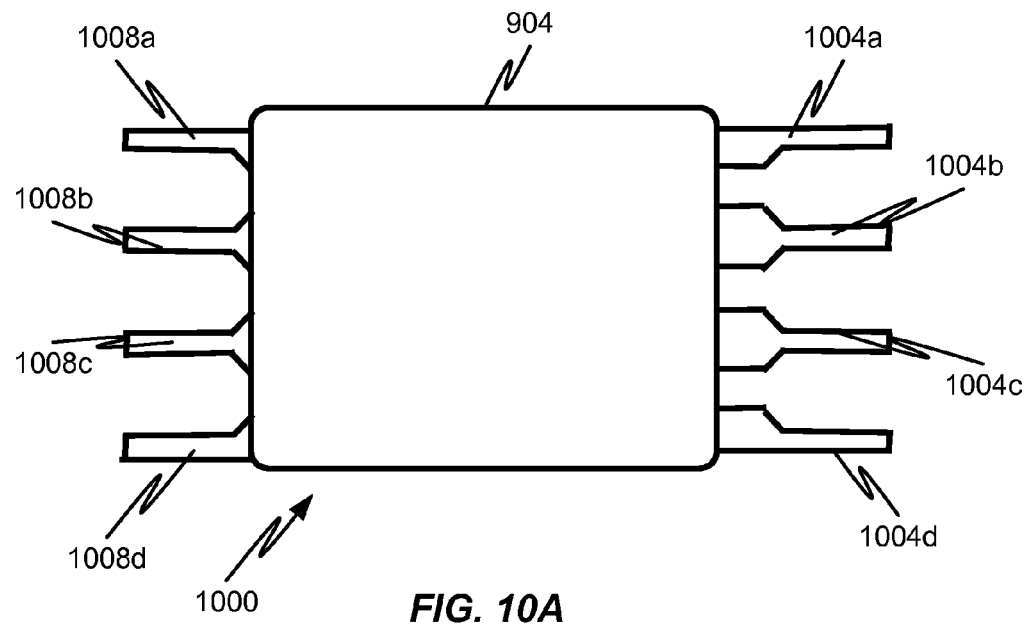
FIG. 10A is a top view of an opto-coupler in a tenth manufacturing step in accordance with embodiments of the present disclosure.
Figure 10B:
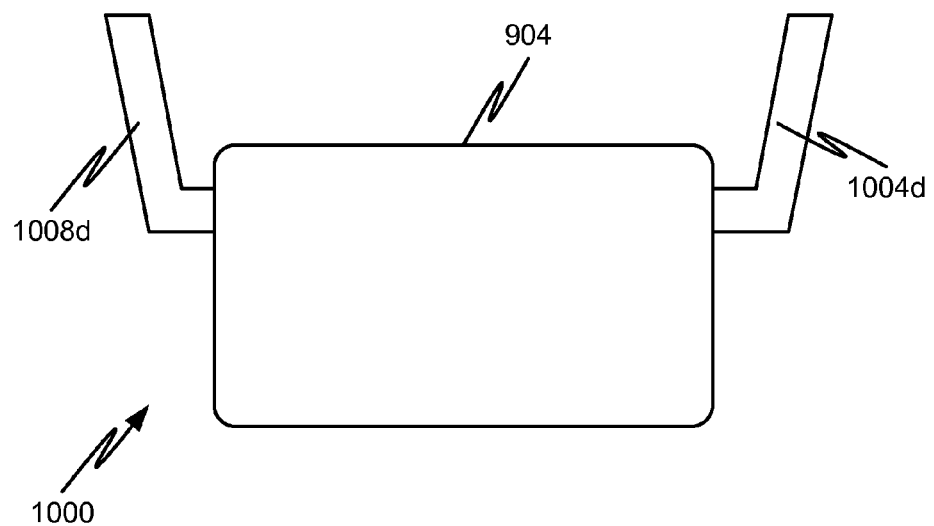
FIG. 10B is a side view of the opto-coupler depicted in FIG. 10A.
Figure 11:
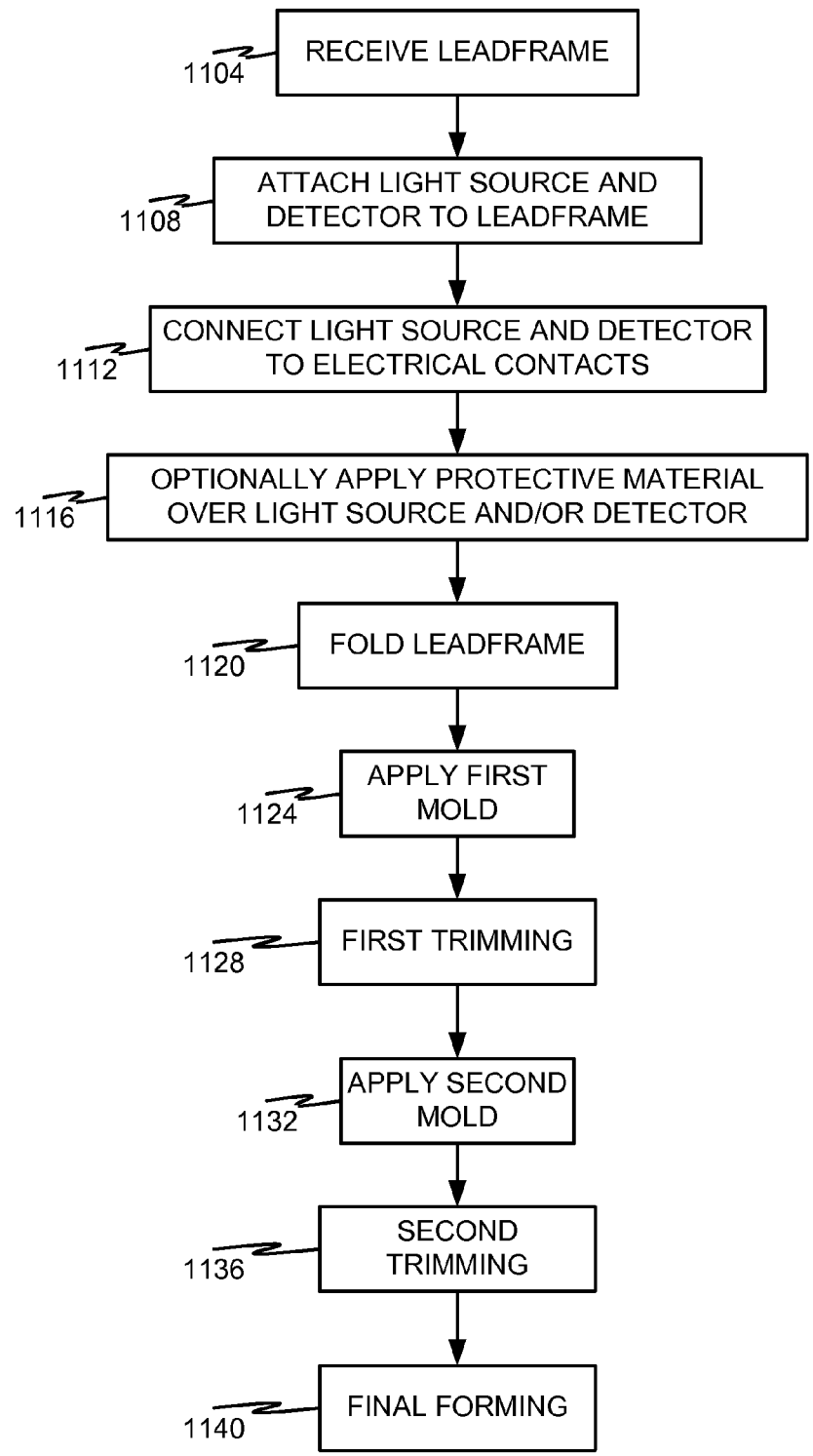
FIG. 11 is a flow chart depicting a method of manufacturing an opto-coupler in accordance with embodiments of the present disclosure.

Thereafter, a second trimming step may be performed (step 1136) to singulate the opto-coupler from the rest of the leadframe sheet 100 and then the leads may be finally formed to create formed leads (step 1140). Specifically, the finally formed leads may be bent such that the opto-coupler is easily inserted into a PCB or the like. As can be seen in FIGS. 10A and 10B, the first side 108 may comprise a first set of finally formed leads 1004a-d and the second side 112 may comprise a second set of finally formed leads 1008a-d. The finally formed leads 1004, 1008 may be bent or folded away from the original plane of the leadframe 104 (e.g., to have a dimension in the y-plane).

Referring now to FIGS. 12-14, a process of manufacturing an opto-coupler according to a second possible configuration will be described in accordance with embodiments of the present disclosure. It should be appreciated that the method steps described herein (e.g., the steps of FIG. 11) may be performed in any order and are not limited to the examples described herein. Moreover, the method described herein can be used to manufacture any type of opto-coupler device described herein, including any intermediate opto-coupler or alternative opto-coupler configuration (e.g., the opto-coupler of FIGS. 1-10 or the opto-coupler of FIGS. 12-14).

Figure 12A:
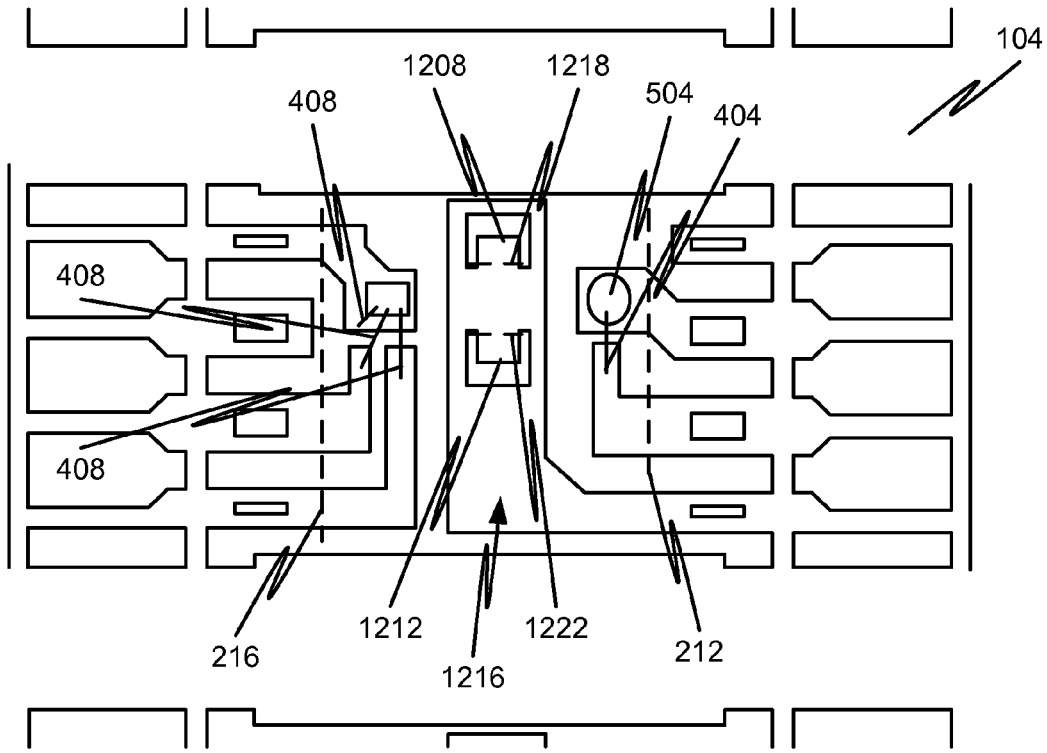
FIG. 12A is a top view of an integrated lens opto-coupler in a fifth manufacturing step in accordance with embodiments of the present disclosure.
Figure 12B:
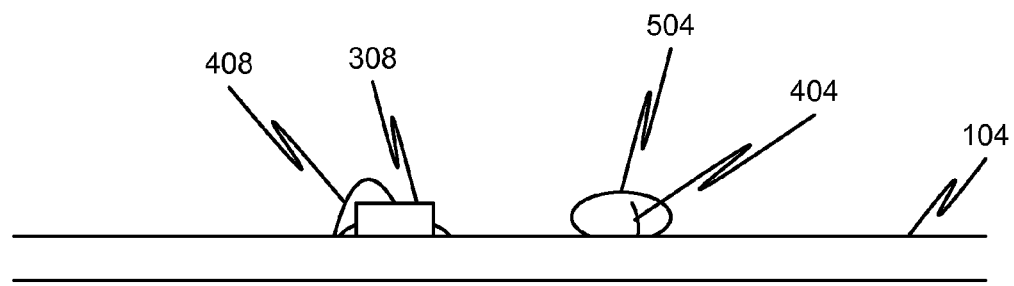
FIG. 12B is a side view of the opto-coupler depicted in FIG. 12A.

With reference now to FIG. 12A, a top view of an integrated lens opto-coupler in a fifth manufacturing step is shown in accordance with embodiments of the present disclosure. Although depicted in a fifth manufacturing step of the process, the inclusion of a protective material 504 with the integrated lens opto-coupler is similarly optional as described above and in FIGS. 5A and 5B. The integrated lens opto-coupler is similar in construction to the first configuration of opto-coupler previously disclosed, but further includes a lens support area 1216 as a part of the leadframe 104. In some embodiments, the lens support area 1216 may be attached to the input side 108 and/or output side 112 of the opto-coupler. Alternatively, the lens support area 1216 may be isolated from the input side 108 and/or the output side 112 of the opto-coupler (e.g., the lens support area 1216 may be center-spanned between the input side 108 and the output side 112). In addition or alternatively, the lens support area 1216 may be cantilevered from one or more sides of the leadframe 104. It is an aspect of the present disclosure that the lens support area may include one or more features to contain a lens element 820. For example, the leadframe may include a first tab 1208 and a second tab 1212 that can be used to cradle at least a portion of the lens element 820. In one embodiment, the first tab 1208 may be folded at or about a first tab fold line 1218 and the second tab 1212 may be folded at or about a second tab fold line 1222. Consistent with lens positioning and attachment techniques, the first and second tabs 1218, 1222 may be folded such that the angle between the faces of the tabs 1218, 1222 positively locates the lens in a given position and even exactly constrain at least a portion of the lens element 820. In one embodiment, the optimal angle between the faces of the tabs 1218, 1222 may be between 45 and 125 degrees. In other embodiments, it is anticipated that the tabs 1218, 1222, if used, may be arranged at an angle between the tab faces anywhere in the range of 1 to 179 degrees).

In some embodiments, the lens support area 1216 may include a cutout to receive a lens element 820. For example, a portion of the lens support area 1216 may include a hole or cutout in an area adjacent to the light source 304 and/or light detector 308. A lens element 820 may be configured to be sized larger than this hole, or cutout, such that when the lens element 820 is inserted into the hole or cutout at least one side of the hole or cutout prevents the lens element 820 from passing completely through the opening. As can be appreciated, this hole, or cutout, can positively locate a lens element 820 in a position within the light path of the opto-coupler.

Figure 13A:
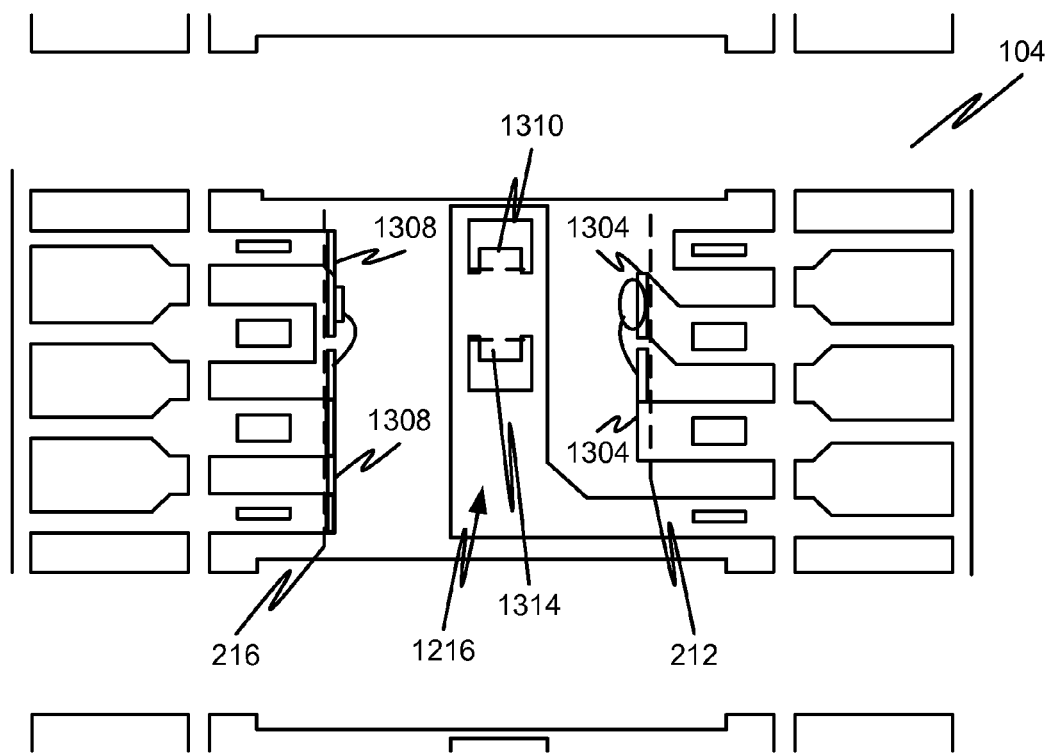
FIG. 13A is a top view of an integrated lens opto-coupler in a sixth manufacturing step in accordance with embodiments of the present disclosure.
Figure 13B:
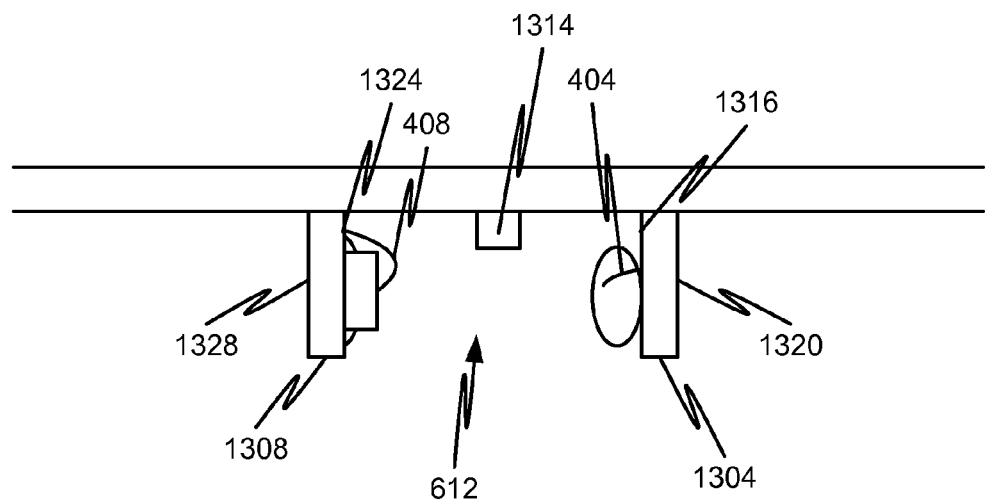
FIG. 13B is a side view of the opto-coupler depicted in FIG. 13A.

The next step in the manufacturing process may include one or more folding steps where the leadframe 104, or leads 120, 124 of the leadframe are folded at or about the fold lines 212, 216 (step 1120). FIGS. 13A and 13B depict the opto-coupler after leads 120, 124 have been folded at or about the fold lines 212, 216. In contrast, the lens support area 1216 and any lead to which it may connect can remain unfolded. As previously disclosed, the tabs 1208, 1212 may be folded at or about the fold lines 1218, 1222 to form angled tabs 1310, 1314 in the y-direction. In some embodiments, the leads 120, 124 are folded in the same direction (e.g., both upward or both downward) such that both the light source 304 and light detector 308 are moved away from the original plane of the leadframe 304 in the y-direction and are not separated by the original plane of the leadframe 304. Additionally or alternatively, the angled tabs 1310, 1314 may be in the same direction as the leads 120, 124 (e.g., both upward or both downward). In some embodiments, one or more leads of the first side 108 may be folded in one direction (e.g., upward) while one or more leads of the second side 112 may be folded in the opposite direction (e.g., downward). This opposite folding may result in the light source 304 being separated from the light detector 308 by the original plane of the leadframe 304. In this case, the lens support area 1216 and/or the connection to it may be folded at such an angle as to keep the lens element 820 in the light path of the opto-coupler. Yet another possible folding configuration may involve folding one or more leads of one side (e.g., folding one or more of leads 120a-d) and not folding any leads of the other side (e.g., not folding any of leads 124a-d)

Although FIGS. 13A and 13B depict the leads 120, 124 being folded in the same direction and being folded to an angle that is approximately orthogonal to the original plane of the leadframe 104 (e.g., parallel to the y-plane), it should be appreciated that embodiments of the present disclosure are not so limited. Rather, one or both leads 120, 124 may be folded by any angle varying between 1 degree and 179 degrees. The amount of folding performed in this step may depend on the material properties of the leadframe 104 and whether the material can undergo significant folding without breaking or inadvertently deforming. The same holds true for the folds of the tabs 1208, 1212, if they are indeed folded. FIG. 13B shows the second tab 1314 of the leadframe folded into a first position to receive and/or capture a lens element 820 in the enhanced isolation gap 612.

The 90 degree folding configuration of FIGS. 13A and 13B may be advantageous when both leads 120, 124 are folded in the same direction because such a folding configuration may result in the light source 304 directly facing the light detector 308. This direct facing of optical components may help increase the efficiency with which light transmitted by the light source 304 is detected at the light detector 308, thereby improving the operational behavior of the opto-coupler. Among other things, the direct facing of optical components may further assist in the manufacturing process of the integrated lens opto-coupler (e.g., making the integration of a lens element 820 between the light source 304 and the light detector 308 a direct and even orthogonal operation). In other words, the assembly process can utilize well known techniques in the assembly of components including but not limited to gravity dependent orientation and/or capture, direct component feed lines, pick-and-place systems, vacuum gripping, automated UV curing, and the like.

Figure 13C:
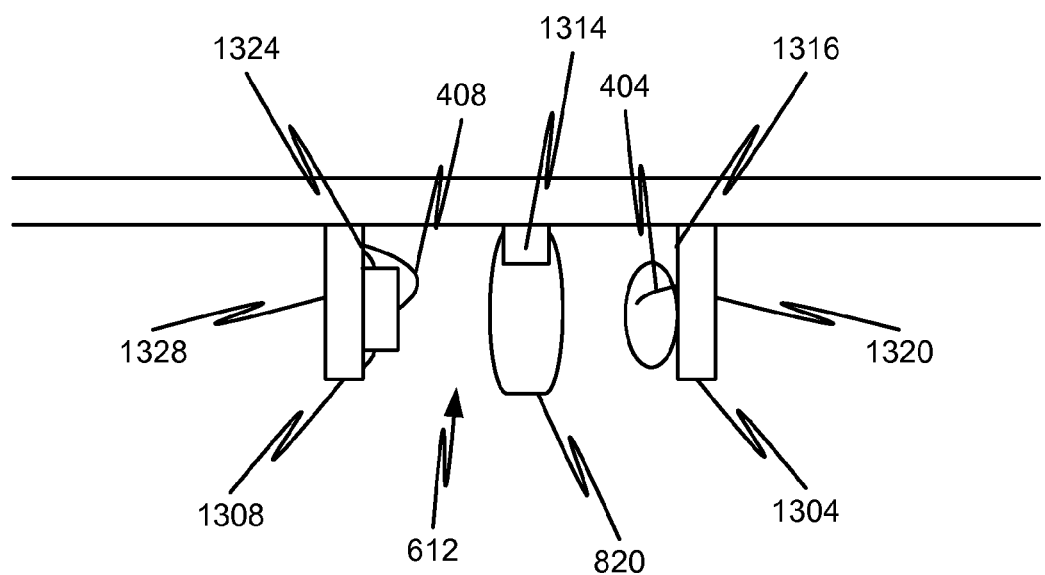
FIG. 13C is a side view of the opto-coupler depicted in FIG. 13A with attached lens element in accordance with embodiments of the present disclosure.

Referring to FIG. 13C a side view of the opto-coupler with attached lens element 820 is shown in accordance with embodiments of the present disclosure. In at least one embodiment, a lens element 820 may be affixed to the leadframe 104 using any of the aforementioned attaching techniques including but not limited to molding, adhering, clamping, pressure setting, bonding, welding, fastening, and the like. In some embodiments, the lens element 820 may be introduced to the leadframe 104 and captured by the tabs 1310, 1314 prior to being bonded in place by a first mold material 704.

Figure 14A:
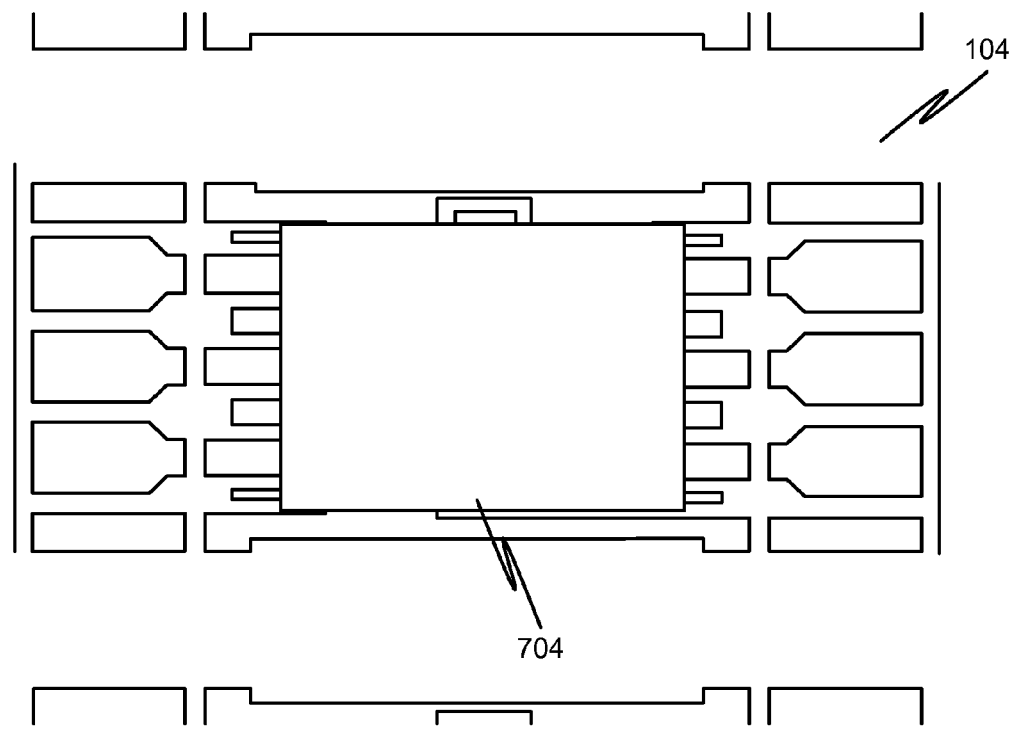
FIG. 14A is a top view of an integrated lens opto-coupler in a seventh manufacturing step in accordance with embodiments of the present disclosure.
Figure 14B:
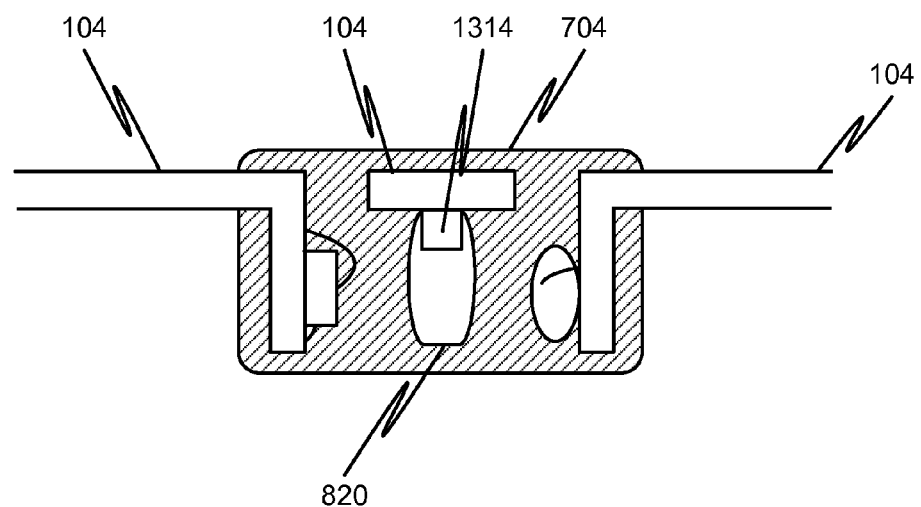
FIG. 14B is a sectioned side view of the opto-coupler depicted in FIG. 14A.

FIG. 14A is a top view of an integrated lens opto-coupler in a seventh manufacturing step in accordance with embodiments of the present disclosure. Specifically, an optically translucent or transparent first mold material 704 may be applied around both leads 120, 124 to essentially fix the relative positions of the leads 120, 124, the optical components attached thereto, including an inserted lens element 820, and the size of the enhanced isolation gap 612. As can be seen in the sectioned view of FIG. 14B a lens element 820 is shown interposed in a position between the light source 304 and the light detector 308 of an opto-coupler. The first mold material is shown at least partially covering the lens element 820. As can be appreciated, the lens element 820 described in the first embodiment of the opto-coupler is substantially similar to the lens element 820 described in the integrated lens opto-coupler. For example, both opto-coupler embodiments utilize a gap disposed between the light source 304 and light detector 308 of the opto-coupler. In both instances, the gap in the insulation of the opto-coupler may be used to, among other things, minimize the amount of first mold material 704 between the light source 304 and the light detector 308 and thereby increase the efficiency of an opto-coupler accommodating a large DTI.

Several embodiments disclosed herein refer to folding steps that are involved in a manufacturing process, where the leadframe 104, or leads 120, 124 of the leadframe 104 are folded at or about fold lines 212, 216. It should be appreciated that these folding steps may be performed prior to presenting a light source 304 and/or light detector 308. As can be expected, the light source 304, light detector 308, and/or any other assembly feature may be introduced to a pre-folded leadframe, or lead(s), and the manufacturing process may continue as described. In some embodiments, a leadframe 104, or one or more leads 120, 124, may be folded in a separate manufacturing process and presented to the manufacturing process to receive at least one of a light source 304, light detector 308, lens element 820, housing 828, first mold material 704, and second mold material. In any event, the manufacturing process may use a pre-folded leadframe from the first step of the manufacturing process disclosed herein.

Although embodiments of the present disclosure do not show the leads as having a specific configuration, it should be appreciated that the leads or relevant sections protruding from the second mold material may comprise any type of known, standardized, or yet-to-be developed configuration such as straight-cut leads, J leads, SOJ leads, gullwing, reverse gullwing, etc.

Additionally, although only single channel opto-coupler devices have been depicted and described herein, it should be appreciated that embodiments of the present disclosure are not so limited. In particular, it is contemplated that opto-coupler devices having one, two, three, four, five, six, . . . , twenty, or more channels may be created with enhanced isolation gaps without departing from the scope of the present disclosure.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An opto-coupler device, comprising:
a leadframe comprising one or more input leads that are electrically isolated from one or more output leads;
a light source mounted to a bonding surface of a first lead, the first lead being in the one or more input leads, wherein the light source is configured to emit light via a first exposed surface;
a light detector mounted to a bonding surface of a second lead, the second lead being in the one or more output leads, wherein the light detector is configured to detect light via a second exposed surface;
an enhanced isolation gap establishing an optical volume between the light source and light detector;
a first mold material provided adjacent to at least one of the light source and the light detector, wherein the first mold material is at least partially within the enhanced isolation gap; and
an efficiency enhancer interposed in at least a portion of the enhanced isolation gap.

2. The opto-coupler device of claim 1, wherein the efficiency enhancer is affixed to at least one of the one or more input leads and the one or more output leads of the leadframe.

3. The opto-coupler device of claim 1, wherein the efficiency enhancer comprises an optical coupling efficiency that is greater than an optical coupling efficiency of the first mold material.

4. The opto-coupler device of claim 1, wherein the efficiency enhancer is configured as an interrupted volume within the first mold material.

5. The opto-coupler device of claim 4, further comprising:
a light-directing element operatively positioned at least partially within the interrupted volume of the first mold material.

6. The opto-coupler device of claim 5, further comprising:
an element housing, wherein the element housing is configured to capture the light-directing element, and wherein the element housing is operatively attached to at least one of the leadframe and first mold material.

7. The opto-coupler device of claim 4, further comprising:
a first cap, wherein the first cap is configured to cover an open area of the interrupted volume, and wherein the first cap comprises a polymeric material.

8. The opto-coupler device of claim 1, further comprising:
a second mold material that surrounds the first mold material, the second mold material being substantially optically opaque.

9. An opto-coupler device, comprising:
- a leadframe comprising one or more input leads that are electrically isolated from one or more output leads;
- a light source configured to emit light according to electrical signals received from the one or more input leads, wherein the light source is mounted to a bonding surface of a first lead, the first lead being in the one or more input leads;
- a light detector configured to detect light emitted by the light source and convert the detected light into electrical signals for transmission by the one or more output leads, wherein the light detector is mounted to a bonding surface of a second lead, the second lead being in the one or more output leads;
- a first mold material provided between the light source and the light detector, wherein the first mold material is at least partially translucent;
- an enhanced isolation gap established between the first lead and the second lead and corresponding to a shortest linear distance between the first lead and second lead, wherein at least one of the first and second lead are folded such that the light source is facing the light detector; and
- an efficiency enhancer interposed between the light source and the light detector, the efficiency enhancer comprising at least a portion of the enhanced isolation gap, and wherein the efficiency enhancer is at least partially transparent.

10. The opto-coupler device of claim 9, wherein the efficiency enhancer is electrically nonconductive and is affixed to the leadframe in an orientation substantially orthogonal to a path of light emitted from the light source.

11. The opto-coupler device of claim 10, wherein the first mold material at least partially covers the efficiency enhancer.

12. The opto-coupler device of claim 10, wherein the efficiency enhancer comprises a lens.

13. The opto-coupler device of claim 9, wherein the first mold material comprises a void, the void being a volume interposed between the light source and the light detector.

14. The opto-coupler device of claim 13, wherein the void comprises the efficiency enhancer.

15. The opto-coupler device of claim 14, wherein the efficiency enhancer comprises at least one gas.

16. The opto-coupler device of claim 14, wherein the efficiency enhancer comprises at least one light-directing element positioned in the void and configured to redirect light emitted from the light source.

17. The opto-coupler device of claim 16, further comprising:
- a housing affixed to the light-directing element and configured to attach to the first mold material and orient the light-directing element within the void.

18. The opto-coupler device of claim 14, further comprising:
- a void cap, wherein the void cap is affixed to the first mold material and configured to at least one of partially cover an open area of the void and retain the efficiency enhancer.

19. An opto-coupler manufactured by a method, the method comprising:
- receiving a leadframe having an input side and an output side separated by a first isolation gap, the first isolation gap corresponding to a first shortest distance between the input side and the output side;
- attaching a light source to the input side;
- attaching a light detector to the output side;
- electrically connecting the light source to the input side with one or more input side wires;
- electrically connecting the light detector to the output side with one or more output side wires;
- positioning an efficiency enhancer at least partially within the first isolation gap between the light source and the light detector; and
- providing a first mold material about the light source and light detector, wherein the first mold material is arranged to at least partially surround the efficiency enhancer.

20. The method of claim 19, wherein the efficiency enhancer is mounted to at least one of the input side and the output side of the leadframe prior to providing the first mold material.

* * * * *